United States Patent
Abels et al.

(10) Patent No.: US 10,787,738 B2
(45) Date of Patent: Sep. 29, 2020

(54) PROCESS FOR THE GENERATION OF THIN INORGANIC FILMS

(71) Applicant: BASF SE, Ludwigshafen am Rhein (DE)

(72) Inventors: Falko Abels, Ludwigshafen (DE); Daniel Loeffler, Ludwigshafen (DE); Hagen Wilmer, Ludwigshafen (DE); Robert Wolf, Regensburg (DE); Christian Roedl, Regensburg (DE); Philipp Bueschelberger, Regensburg (DE)

(73) Assignee: BASF SE, Ludwigshafen am Rhein (DE)

( * ) Notice: Subject to any disclaimer, the term of this patent is extended or adjusted under 35 U.S.C. 154(b) by 75 days.

(21) Appl. No.: 16/063,603

(22) PCT Filed: Jan. 17, 2017

(86) PCT No.: PCT/EP2017/050858
§ 371 (c)(1),
(2) Date: Jun. 18, 2018

(87) PCT Pub. No.: WO2017/129440
PCT Pub. Date: Aug. 3, 2017

(65) Prior Publication Data
US 2019/0003049 A1    Jan. 3, 2019

(30) Foreign Application Priority Data

Jan. 27, 2016   (EP) ..................................... 16152937

(51) Int. Cl.
| | | |
|---|---|---|
| *C23C 16/18* | (2006.01) | |
| *C23C 16/448* | (2006.01) | |
| *C07F 15/06* | (2006.01) | |
| *C23C 16/455* | (2006.01) | |
| *C07F 9/6568* | (2006.01) | |
| *C23C 16/34* | (2006.01) | |
| *C23C 16/40* | (2006.01) | |
| *C01B 21/06* | (2006.01) | |
| *C01G 51/04* | (2006.01) | |
| *C01G 53/04* | (2006.01) | |

(52) U.S. Cl.
CPC ...... *C23C 16/4486* (2013.01); *C07F 9/65686* (2013.01); *C07F 15/06* (2013.01); *C23C 16/34* (2013.01); *C23C 16/40* (2013.01); *C23C 16/45525* (2013.01); *C01B 21/0622* (2013.01); *C01G 51/04* (2013.01); *C01G 53/04* (2013.01); *C01P 2002/88* (2013.01)

(58) Field of Classification Search
CPC .......................... C23C 16/18; C23C 16/45525; C07F 9/65686
See application file for complete search history.

(56) References Cited

U.S. PATENT DOCUMENTS

| | | | | |
|---|---|---|---|---|
| 5,872,357 | A * | 2/1999 | Flanagan | C07F 9/65815 250/252.1 |
| 6,156,692 | A * | 12/2000 | Nubel | B01J 31/185 502/150 |
| 2005/0283026 | A1* | 12/2005 | Dwyer | C08G 61/08 568/9 |
| 2008/0026577 | A1 | 1/2008 | Shenai-Khatkhate et al. | |
| 2008/0026578 | A1* | 1/2008 | Shenai-Khatkhate | C07F 1/08 438/681 |
| 2008/0221345 | A1* | 9/2008 | Winde | B01J 31/2265 556/13 |
| 2009/0226612 | A1 | 9/2009 | Ogawa et al. | |
| 2009/0281205 | A1* | 11/2009 | Piotrowski | C08G 18/48 521/108 |
| 2012/0022252 | A1* | 1/2012 | Shekhar | B01J 31/2423 544/106 |
| 2016/0348243 | A1 | 12/2016 | Xu et al. | |
| 2017/0175267 | A1 | 6/2017 | Strautmann et al. | |

(Continued)

FOREIGN PATENT DOCUMENTS

| | | |
|---|---|---|
| EP | 1884517 A1 | 2/2008 |
| EP | 1887012 A1 | 2/2008 |

(Continued)

OTHER PUBLICATIONS

Pudovik, A N, et al., "Development of the Chemistry of Organophosphorus Compounds in the Work of the Kazan' School of Organophosphorus Chemists". 1967 Russ. Chem. Rev. 36 639-656.*

(Continued)

*Primary Examiner* — Bret P Chen
(74) *Attorney, Agent, or Firm* — Oblon, McClelland, Maier & Neustadt, L.L.P.

(57) ABSTRACT

Processes for the generation of thin inorganic films on substrates, in particular atomic layer deposition processes. In particular, a process of bringing a compound of general formula (I) into the gaseous or aerosol state $$L_n \text{- - - } M \text{- - - } X_m \qquad (I)$$

Figure 1:
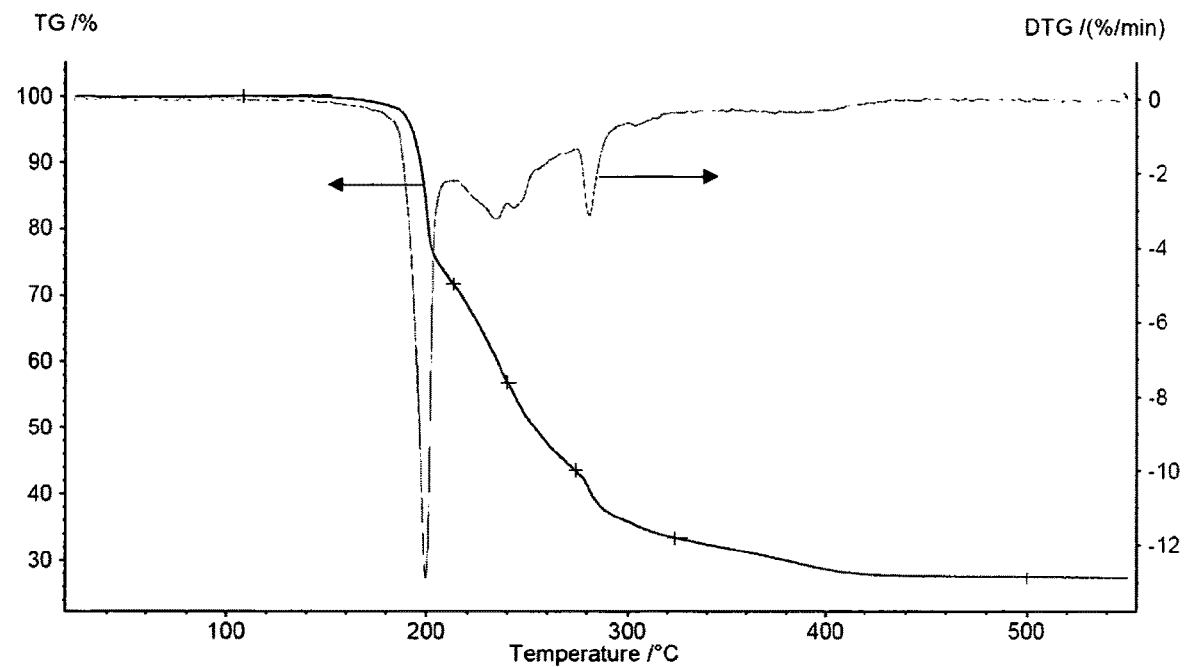

and depositing the compound of general formula (I) from the gaseous or aerosol state onto a solid substrate, wherein M is a metal, L is a ligand which coordinates to M and contains at least one phosphorus-carbon multiple bond, wherein L contains a phosphorus-containing heterocyclic ring or a phosphorus-carbon triple bond, X is a ligand which coordinates to M, n is 1 to 5, and m is 0 to 5.

11 Claims, 3 Drawing Sheets

(56) References Cited

U.S. PATENT DOCUMENTS

| | | | |
|---|---|---|---|
| 2017/0233865 A1 | 8/2017 | Strautmann et al. | |
| 2017/0253688 A1* | 9/2017 | Yamauchi | C08G 18/79 |
| 2018/0008970 A1* | 1/2018 | Kwon | C08G 64/32 |
| 2018/0044357 A1 | 2/2018 | Spielmann et al. | |
| 2018/0187306 A1 | 7/2018 | Ahlf et al. | |

FOREIGN PATENT DOCUMENTS

| | | | | |
|---|---|---|---|---|
| JP | 6-158332 A | | 6/1994 | |
| JP | 2010-215842 | * | 9/2010 | |
| WO | WO 98/30569 | * | 7/1998 | C07F 9/02 |
| WO | WO 02/02574 A1 | | 1/2002 | |
| WO | WO 2004/005223 A1 | * | 1/2004 | C07C 6/04 |

OTHER PUBLICATIONS

Hua, Guoxiong, et al., "Unexpected four- and eight-membered organo P—Se heterocycles". Chem. Commun., 2007, 1465-1467.*
Wann, Derek A., et al., "Multiple bonding versus cage formation in organophosphorus compounds: the gas-phase structures of tricyclo-P3(CBut )2Cl and P C-But determined by electron diffraction and computational methods". Dalton Trans., 2011, 40, 5611-5616.*
Westernberg, Hauke, et al., "C≡C Triple Bond Activation by Heterocyclic Aluminum Phosphinides". Organometallics 2010, 29, 1323-1330.*
Appel, R., "Phosphorus-Carbon Compounds with pπ-pπ Bonds". Quin and Verkade; Phosphorus Chemistry ACS Symposium Series, vol. 171; American Chemical Society: Washington, DC, 1981, Chapter 1, pp. 1-9.*
Regitz, M., et al., "Directed Synthesis of Phosphorus-Carbon Cage Compounds—A Challenge in Organophosphorus Chemistry". Phosphorus, Sulfur, and Silicon and the Related Elements, 109:1-4, (1996) 425-428, DOI: 10.1080/10426509608545181. Abstract Only.*
U.S. Appl. No. 15/775,856, filed May 14, 2018, Torben Adermann, et al.
U.S. Appl. No. 15/779,570, filed May 29, 2018, Falko Abels.
U.S. Appl. No. 15/779,893, filed May 30, 2018, Torben Adermann, et al.
Written Opinion of the International Searching Authority dated Mar. 17, 2017 in PCT/EP2017/050858 filed Jan. 17, 2017, 5 pages.
Extended European Search Report dated Jul. 5, 2016 in Patent Application No. 16152937.5, 3 pages.
"Gold-Phosphonium Complex Materials for Laser Beam Photochemical Vapor Deposition" Database Caplus [Online] Chemical Abstracts Service, Database accession No. 1995:394722, XP002759225, 1995, 1 Page.
Andrew J. M. Caffyn, et al. "Reactivity of a ($\eta^5$-Phospholyl)cobalt Dicarbonyl Complex. Synthesis of [Co$_2$($\eta^5$-PC$_4$H$_2$$^t$Bu$_2$)$_2$(CO)$_2$] and [Co$_2$($\eta^5$-PC$_4$H$_2$$^t$Bu$_2$)$_2$($\mu$-CHCO$_2$Et)(CO)$_2$]" Organometallics, vol. 16, No. 10, 1997, pp. 2049-2054.
Andrei Chirila, et al., "Main Group and Transition Metal-Mediated Phosphaalkyne Oligomerizations" Coordination Chemistry Reviews, vol. 270-271, Jul. 2014, pp. 57-74.
James C. T. R. Burckett-St. Laurent, et al., "Novel Transition Metal Phospha-Alkyne Complexes. X-Ray Crystal and Molecular Structure of a Side-Bonded Bu$^t$C [triple bond, length as m-dash]P Complex of Zerovalent Platinum, Pt(PPh$_3$)$_2$(Bu$^t$CP)" Journal of the Chemical Society, Chemical Communications, 1981, pp. 1141-1143.
Steven M. George, "Atomic Layer Deposition: An Overview", Chemical Reviews, vol. 110, No. 1, 2010, pp. 111-131.
Robert Wolf, et al., "The Homoleptic Sandwich Anion [Co(P$_2$C$_2$$^t$Bu$_2$)$_2$]—: A Versatile Building Block for Phosphaorganometallic Chemistry" Angewandte Chemie, vol. 47, Issue 24, Jun. 2, 2008, pp. 4584-4587.
Robert Wolf, et al., "Homoleptic Diphosphacyclobutadiene Complexes [M($\eta^4$-P$_2$C$_2$R$_2$)$_2$]$^{x-}$ (M=Fe, Co; x=0, 1)" Chemistry: A European Journal, vol. 16, Issue 48, Dec. 27, 2010, pp. 14322-14334.
International Search Report dated Mar. 17, 2017, in PCT/EP2017/050858, filed Jan. 17, 2017.

* cited by examiner

PROCESS FOR THE GENERATION OF THIN INORGANIC FILMS

The present invention is in the field of processes for the generation of thin inorganic films on substrates, in particular atomic layer deposition processes.

With the ongoing miniaturization, e.g. in the semiconductor industry, the need for thin inorganic films on substrates increases while the requirements of the quality of such films become stricter. Thin inorganic films serve different purposes such as barrier layers, dielectrics, conducting features, capping, or separation of fine structures. Several methods for the generation of thin inorganic films are known. One of them is the deposition of film forming compounds from the gaseous state on a substrate. In order to bring metal atoms into the gaseous state at moderate temperatures, it is necessary to provide volatile precursors, e.g. by complexation the metals with suitable ligands. These ligands need to be removed after deposition of the complexed metals onto the substrate.

WO 02/02574 A1 discloses complexes containing trialkyl or triarylphosphane ligands for the use in chemical vapor deposition. However, such complexes leave a significant amount of impurities in the metal film after decomposition. Also, the complexes are not sufficiently stable upon storage and heating.

A. Chirila et al. disclose in Coordination Chemistry Reviews volume 270-271 (2014) pages 57-74 phosphaalkyne complexes. However, no indication is given on their suitability in gas phase deposition processes.

It was an object of the present invention to provide a process for the generation of metal-containing films of high quality and reproducibility on solid substrates under economically feasible conditions. It was desired that this process can be performed with as little decomposition of the precursor comprising the metal as possible before it is in contact with the solid substrate. At the same time it was desired to provide a process in which the precursor is easily decomposed after deposited on a solid substrate leaving very little impurities in the metal film. It was also aimed at providing a process using metal-containing precursors which can easily be modified and still remain stable in order to fit the precursors' properties to the particular needs.

These objects were achieved by a process comprising bringing a compound of general formula (I) into the gaseous or aerosol state

$$L_n \text{---} M \text{---} X_m \quad (I)$$

and depositing the compound of general formula (I) from the gaseous or aerosol state onto a solid substrate, wherein M is a metal, L is a ligand which coordinates to M and contains at least one phosphorus-carbon multiple bond, wherein L contains a phosphorus-containing heterocyclic ring or a phosphorus-carbon triple bond, X is a ligand which coordinates to M, n is 1 to 5, and m is 0 to 5.

The present invention further relates to the use of the compound general formula (I), wherein M is a metal, L is a ligand which coordinates to M and contains at least one phosphorus-carbon multiple bond, wherein L contains a phosphorus-containing heterocyclic ring or a phosphorus-carbon triple bond, X is a ligand which coordinates to M, n is 1 to 5, and m is 0 to 5 for a film formation process on a solid substrate.

Preferred embodiments of the present invention can be found in the description and the claims. Combinations of different embodiments fall within the scope of the present invention.

In the process according to the present invention a compound of general formula (I) is brought into the gaseous or aerosol state. The ligand L is normally bound to M via at least one of the π-bonds of the phosphorus-carbon multiple bond.

According to the present invention, M is a metal. These include Li, Be, Na, Mg, Al, K, Ca, Sc, Ti, V, Cr, Mn, Fe, Co, Ni, Cu, Zn, Ga, Rb, Sr, Y, Zr, Nb, Mo, Tc, Ru, Rh, Pd, Ag, Cd, In Sn, Cs, Ba, La, Ce, Pr, Nd, Pm, Sm, Eu, Gd, Tb, Dy, Ho, Er, Tm, Yb, Lu, Hf, Ta, W, Re, Os Ir, Pt, Au, Hg, Tl, Bi. Preferably, M is a transition metal, more preferably Ni, Co, Mn, Ti, Ta or W, in particular Ni or Co.

The metal M can be in various oxidation states, for example 0, +1, +2, or +3. Preferably, the compound of general formula (I) is electrically neutral. If M is charged, L and X preferably compensate for the charge to render the compound of general formula (I) electrically neutral.

According to the present invention L is a ligand which coordinates to M and contains at least one phosphorus-carbon multiple bond. Phosphorus-carbon multiple bonds include phosphorus-carbon double bonds and phosphorus-carbon triple bonds. It is possible that L contains only one phosphorus-carbon double bond or triple bond. It is also possible that L contains more than one phosphorus-carbon double bond or triple bond. In this case, it is possible that these multiple bonds stand in conjugation to each other. In some cases, this conjugation forms an aromatic system. In the context of the present invention, a phosphorous-carbon bond which is part of an aromatic system is regarded as a phosphorus-carbon multiple bond.

According to the present invention, n is 1 to 5 which means that n is 1, 2, 3, 4 or 5. Normally, for small metals M, n is 1 to 3, for example for first row transition metals such as Co or Ni. For larger metals, for example W, n can be 4 or 5.

According to the present invention the ligand X in the compound of general formula (I) can be any ligand which coordinates M. If the compound of general formula (I) contains more than one X, all X can be the same or different to each other, preferably at least two X are different to each other, in particular all X are different to each other. Any or all X can be in any ligand sphere of M, e.g. in the inner ligand sphere, in the outer ligand sphere, or only loosely associated to M. Preferably, X is in the inner ligand sphere of M. It is believed that if all ligand X are in the inner ligand sphere of M the volatility of the compound of general formula (I) is high such that it can be brought into the gaseous or aerosol state without decomposition.

The ligand X in the compound of general formula (I) according to the present invention includes anions of halogens like fluoride, chloride, bromide or iodide and pseudo-halogens like cyanide, isocyanide, cyanate, isocyanate, thiocyanate, isothiocyanate, or azide. Further suitable ligands X are alkyl anions like methyl, ethyl, butyl, or neopentyl anions as well as silicon bearing alkyl groups such as trimethylsilyl methyl. Another possible ligand X is hydride, nitric oxide (NO) and carbonmonoxide (CO).

Furthermore, X can be a ligand which coordinates M via a neutral or anionic nitrogen atom, for example by deprotonation before coordination to M. Such ligands include amine ligands in which the coordinating nitrogen atom is either aliphatic like in dialkylamine, piperidine, morpholine, hexamethyldisilazane; amino imides; or aromatic like in pyrrole, indole, pyridine, or pyrazine. Preferably, X is a ligand which coordinates via at least two neutral or anionic nitrogen atoms. These include amidinates such as acetamidine or N,N'-bis-isopropylacetamidine; guanidinates such as guanidine; aminoimines such as 2-N-tertbutylamino-2-methylpropanal-N-tertbuylimine; diimines such as glyoxal-N,N'-bis-tertbutyl-diimine or 2,4-pentanedione-diimine; iminopyrroles such as pyrrol-2-carbald-tertbutylimine or pyrrol-2,5-biscarbald-tertbutyldiimine It is also possible that X is a ligand in which an oxygen atom coordinates to M. Examples are alkanolates, tetrahydrofurane, acetylacetonate, or 1,1,1,5,5,5-pentafluoroacetylacetone. Other suitable examples for X include both a nitrogen and an oxygen atom which both coordinate to M including dimethylamino-iso-propanol, formamide, acetamide, 2,4-pentandione-N-isopropy-limine.

Also suitable for X are ligands which coordinate via a phosphorus atom to M. These include tri-substituted phosphanes including trialkylphosphanes, dialkylarylphosphanes, alkyl-diarylphosphanes or triarylphosphanes, wherein the alkyl or the aryl groups can be the same or different to each other if more than one alkyl or aryl group is present. Examples include trimethyl phosphane, trimethoxyphosphane, methyl-dimethoxy phosphane, tri-tertbutyl phosphane, tricyclohexyl phosphane, di-isopropyl-tert-butyl phosphane, dimethyl-tert-butyl phosphane, triphenyl phosphane, and tritolylphosphane.

X can also be an unsaturated hydrocarbon which coordinates with a π-bond to M. These can be aliphatic or aromatic. Unsaturated hydrocarbons include olefins like ethylene, propylene, iso-butylene, cyclohexene, cyclooctene, cyclooctadiene, styrene; and alkynes like ethyne, propyne, 2-butyne. X can also be an unsaturated anionic hydrocarbon which can coordinate both via the anion and the unsaturated bond such as allyl or 2-methyl-allyl. Aromatic X which coordinate via a π-bond to M include cyclopentadiene anions and substituted cyclopentadiene anions.

Small ligands which have a low vaporization temperature are preferred for X. Small anionic ligands which can easily be transformed into volatile neutral compounds upon protonation, for example by surface-bound protons, are preferred for X. Examples include methyl, ethyl, propyl, neopentyl, trimethylsilyl methyl, dimethylamide, diethylamide, allyl, 2-methyl-allyl. Preferred ligands X are CO, NO, cyanide, bromide, methyl, ethylene, cyclooctene, 2-butyne, or trialkylphosphanes, in particular CO, NO, or trimethylphosphane.

According to the present invention m is 0 to 5, which means that m is 0, 1, 2, 3, 4 or 5. The sum of n and m depends on the available coordination sites of the metal M. Normally, the sum is not larger than 8, for smaller metals M the sum is often not more than 6.

It is preferred that the molecular weight of the compound of general formula (I) is up to 1000 g/mol, more preferred up to 800 g/mol, in particular up to 600 g/mol, such as up to 500 g/mol.

L can contain a phosphorus-containing heterocyclic ring. Such rings include four-membered rings, five-membered rings, six-membered rings, seven-membered rings and eight-membered rings, preferably four-membered rings. It is possible that the ring contains one, two, three or four phosphorus atoms, preferably two. More preferably, L is $L^1$, so the compound of general formula (I) is a compound of general formula (Ia)

(Ia)

wherein $R^1$ and $R^2$ are independent of each other nothing, hydrogen, an alkyl group, an aryl group or a silyl group, and wherein $R^3$ and $R^4$ are independent of each other an alkyl group, an aryl group or a silyl group.

$R^1$ and $R^2$, $R^3$, and $R^4$ can be all the same or two or three are the same and the remaining are different or they are all different to each other. Preferably, at least two of $R^1$, $R^2$, $R^3$, and $R^4$ are the same, more preferably $R^1$ and $R^2$ are the same and $R^3$ and $R^4$ are the same. Preferably, $R^1$ and $R^2$ are nothing. Preferably, $R^3$ and $R^4$ are an alkyl group.

An alkyl group can be linear or branched. Examples for a linear alkyl group are methyl, ethyl, n-propyl, n-butyl, n-pentyl, n-hexyl, n-heptyl, n-octyl, n-nonyl, n-decyl. Examples for a branched alkyl group are iso-propyl, iso-butyl, sec-butyl, tert-butyl, tert-pentyl, neo-pentyl, iso-pentyl, sec-pentyl, 3-pentyl, 2-methyl-pentyl, 2-ethyl-hexyl, cyclopropyl, cyclohexyl, indanyl, norbornyl, or adamantyl. Preferably, the alkyl group is a $C_1$ to $C_8$ alkyl group, more preferably a $C_1$ to $C_6$ alkyl group, in particular a $C_1$ to $C_4$ alkyl group, such as methyl or ethyl.

Aryl groups include aromatic hydrocarbons such as phenyl, naphthalenyl, anthrancenyl, phenanthrenyl groups and heteroaromatic groups such as pyrryl, furanyl, thienyl, pyridinyl, quinoyl, benzofuryl, benzothiophenyl, thienothienyl. Several of these groups or combinations of these groups are also possible like biphenyl, thienophenyl or furanylthienyl. Aryl groups can be substituted for example by halogens like fluoride, chloride, bromide, iodide; by pseudohalogens like cyanide, cyanate, thiocyanate; by alcohols; alkyl chains or alkoxy chains; preferably alkyl chains such as in tolyl, xylyl or mesityl. Aromatic hydrocarbons are preferred, phenyl is more preferred.

A silyl group is a silicon atom with typically three substituents. Preferably a silyl group has the formula $SiY_3$, wherein Y is independent of each other hydrogen, an alkyl group, an aryl group or a silyl group. It is possible that all three Y are the same or that two Y are the same and the remaining Y is different or that all three Y are different to each other. Alkyl and aryl groups are as described above. Examples for siliyl groups include $SiH_3$, methylsilyl, trimethylsilyl, triethylsilyl, tri-n-propylsilyl, tri-iso-propylsilyl, tricyclohexylsilyl, dimethyl-tert-butylsilyl, di methylcyclohexylsilyl, methyl-di-iso-propylsilyl, triphenylsilyl, phenylsilyl, dimethylphenylsilyl, pentamethyldisilyl.

Some preferred examples for the compound of general formula (I) with the ligand $L^1$ are given in the following table.

| Compound | M | n | $R^1$ | $R^2$ | $R^3$ | $R^4$ | X | m |
|---|---|---|---|---|---|---|---|---|
| Ia-1 | Co | 2 | — | — | tert-butyl | tert-butyl | — | 0 |
| Ia-2 | Co | 2 | — | — | tert-butyl | tert-butyl | H | 1 |

-continued

| Compound | M | n | R¹ | R² | R³ | R⁴ | X | m |
|---|---|---|---|---|---|---|---|---|
| Ia-3 | Co | 2 | methyl | — | tert-butyl | tert-butyl | — | 0 |
| Ia-4 | Co | 2 | trimethyl-silyl | — | tert-butyl | tert-butyl | — | 0 |
| Ia-5 | Co | 1 | — | — | tert-butyl | tert-butyl | cp | 1 |
| Ia-6 | Co | 2 | H | — | tert-butyl | tert-butyl | — | 0 | cp stands for cyclopentadienyl

Another preferred ligand L is $L^2$, so the compound of general formula (I) is a compound of general formula (Ib)

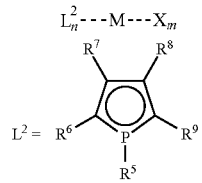

(Ib)

wherein $R^5$ is nothing, hydrogen, an alkyl group, an aryl group or a silyl group, and wherein $R^6$, $R^7$, $R^8$ and $R^9$ are independent of each other hydrogen, an alkyl group, an aryl group or a silyl group. The definitions and preferred embodiments are as described above.

Some preferred examples for the compound of general formula (I) with the ligand $L^2$ are given in the following table.

| Compound | M | n | R⁵ | R⁶ | R⁷ | R⁸ | R⁹ | X | m |
|---|---|---|---|---|---|---|---|---|---|
| Ib-1 | Co | 1 | — | methyl | methyl | methyl | methyl | CO | 2 |
| Ib-2 | Co | 1 | — | methyl | methyl | methyl | methyl | COD | 1 |
| Ib-3 | Co | 1 | — | tert-butyl | H | H | tert-butyl | COD | 1 |
| Ib-4 | Co | 1 | — | tert-butyl | H | H | tert-butyl | CO | 2 |

COD stands for 1,5-cycloocatdiene

L can contain a phosphorus-carbon triple bond such as substituted phosphaethynes. In some cases, the compound of general formula (I) forms a dimer which is bridged by such L. In this preferred case, the compound of general formula (I) is a dimer of general formula (Ic)

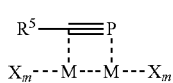

(Ic)

wherein $R^5$ is an alkyl group, an aryl group or a silyl group. The alkyl, aryl and silyl groups are as described above. It is particularly preferred if M in general formula (Ic) is Co.

Some preferred examples for the compound of general formula (Ic) are given the following table.

| Compound | M | R⁵ | X | m |
|---|---|---|---|---|
| Ic-1 | Co | tert-butyl | CO | 3 |
| Ic-2 | Co | adamatyl | CO | 3 |
| Ic-3 | Co | methyl | CO | 3 |
| Ic-4 | Co | iso-propyl | CO | 3 |

The compound of general formula (I) used in the process according to the present invention is used at high purity to achieve the best results. High purity means that the substance used contains at least 90 wt.-% compound of general formula (I), preferably at least 95 wt.-% compound of general formula (I), more preferably at least 98 wt.-% compound of general formula (I), in particular at least 99 wt.-% compound of general formula (I). The purity can be determined by elemental analysis according to DIN 51721 (Prüfung fester Brennstoffe—Bestimmung des Gehaltes an Kohlenstoff and Wasserstoff—Verfahren nach Radmacher-Hoverath, August 2001).

In the process according to the present invention the compound of general formula (I) is brought into the gaseous or aerosol state. This can be achieved by heating the compound of general formula (I) to elevated temperatures. In any case a temperature below the decomposition temperature of the compound of general formula (I) has to be chosen. Preferably, the heating temperature ranges from slightly above room temperature to 300° C., more preferably from 30° C. to 250° C., even more preferably from 40° C. to 200° C., in particular from 50° C. to 150° C.

Another way of bringing the compound of general formula (I) into the gaseous or aerosol state is direct liquid injection (DLI) as described for example in US 2009/0226612 A1. In this method the compound of general formula (I) is typically dissolved in a solvent and sprayed in a carrier gas or vacuum. Depending on the vapor pressure of the compound of general formula (I), the temperature and the pressure the compound of general formula (I) is either brought into the gaseous state or into the aerosol state. Various solvents can be used provided that the compound of general formula (I) shows sufficient solubility in that solvent such as at least 1 g/l, preferably at least 10 g/l, more preferably at least 100 g/l. Examples for these solvents are coordinating solvents such as tetrahydrofuran, dioxane, diethoxyethane, pyridine or non-coordinating solvents such as hexane, heptane, benzene, toluene, or xylene. Solvent mixtures are also suitable. The aerosol comprising the compound of general formula (I) should contain very fine liquid droplets or solid particles. Preferably, the liquid droplets or solid particles have a weight average diameter of not more than 500 nm, more preferably not more than 100 nm. The weight average diameter of liquid droplets or solid particles can be determined by dynamic light scattering as described in ISO 22412:2008. It is also possible that a part of the compound of general formula (I) is in the gaseous state and the rest is in the aerosol state, for example due to a limited vapor pressure of the compound of general formula (I) leading to partial evaporation of the compound of general formula (I) in the aerosol state.

Alternatively, the compound of general formula (I) can be brought into the gaseous or aerosol state by direct liquid evaporation (DLE) as described for example by J. Yang et al. (Journal of Materials Chemistry, 2015). In this method, the compound of general formula (I) is mixed with a solvent, for example a hydrocarbon such as tetradecane, and heated below the boiling point of the solvent. By evaporation of the solvent, the compound of general formula (I) is brought into the gaseous or aerosol state. This method has the advantage that no particulate contaminants are formed on the surface.

It is preferred to bring the compound of general formula (I) into the gaseous or aerosol state at decreased pressure. In this way, the process can usually be performed at lower heating temperatures leading to decreased decomposition of the compound of general formula (I).

It is also possible to use increased pressure to push the compound of general formula (I) in the gaseous or aerosol state towards the solid substrate. Often, an inert gas, such as nitrogen or argon, is used as carrier gas for this purpose. Preferably, the pressure is 10 bar to $10^{-7}$ mbar, more preferably 1 bar to $10^{-3}$ mbar, in particular 1 to 0.01 mbar, such as 0.1 mbar.

In the process according to the present invention a compound of general formula (I) is deposited on a solid substrate from the gaseous or aerosol state. The solid substrate can be any solid material. These include for example metals, semimetals, oxides, nitrides, and polymers. It is also possible that the substrate is a mixture of different materials. Examples for metals are aluminum, steel, zinc, and copper. Examples for semimetals are silicon, germanium, and gallium arsenide. Examples for oxides are silicon dioxide, titanium dioxide, and zinc oxide. Examples for nitrides are silicon nitride, aluminum nitride, titanium nitride, and gallium nitride. Examples for polymers are polyethylene terephthalate (PET), polyethylene naphthalene-dicarboxylic acid (PEN), and polyamides.

The solid substrate can have any shape. These include sheet plates, films, fibers, particles of various sizes, and substrates with trenches or other indentations. The solid substrate can be of any size. If the solid substrate has a particle shape, the size of particles can range from below 100 nm to several centimeters, preferably from 1 μm to 1 mm. In order to avoid particles or fibers to stick to each other while the compound of general formula (I) is deposited onto them, it is preferably to keep them in motion. This can, for example, be achieved by stirring, by rotating drums, or by fluidized bed techniques.

The deposition takes place if the substrate comes in contact with the compound of general formula (I). Generally, the deposition process can be conducted in two different ways: either the substrate is heated above or below the decomposition temperature of the compound of general formula (I). If the substrate is heated above the decomposition temperature of the compound of general formula (I), the compound of general formula (I) continuously decomposes on the surface of the solid substrate as long as more compound of general formula (I) in the gaseous or aerosol state reaches the surface of the solid substrate. This process is typically called chemical vapor deposition (CVD). Usually, an inorganic layer of homogeneous composition, e.g. the metal oxide or nitride, is formed on the solid substrate as the organic material is desorbed from the metal M. Typically the solid substrate is heated to a temperature in the range of 300 to 1000° C., preferably in the range of 350 to 600° C.

Alternatively, the substrate is below the decomposition temperature of the compound of general formula (I). Typically, the solid substrate is at a temperature equal to or lower than the temperature of the place where the compound of general formula (I) is brought into the gaseous or aerosol state, often at room temperature or only slightly above. Preferably, the temperature of the substrate is at least 30° C. lower than the place where the compound of general formula (I) is brought into the gaseous or aerosol state. Preferably, the temperature of the substrate is from room temperature to 400° C., more preferably from 100 to 300° C., such as 150 to 220° C.

The deposition of compound of general formula (I) onto the solid substrate is either a physisorption or a chemisorption process. Preferably, the compound of general formula (I) is chemisorbed on the solid substrate. One can determine if the compound of general formula (I) chemisorbs to the solid substrate by exposing a quartz microbalance with a quartz crystal having the surface of the substrate in question to the compound of general formula (I) in the gaseous or aerosol state. The mass increase is recorded by the eigen frequency of the quartz crystal. Upon evacuation of the chamber in which the quartz crystal is placed the mass should not decrease to the initial mass, but about a monolayer of the residual compound of general formula (I) remains if chemisorption has taken place. In most cases where chemisorption of the compound of general formula (I) to the solid substrate occurs, the X-ray photoelectron spectroscopy (XPS) signal (ISO 13424 EN—Surface chemical analysis—X-ray photoelectron spectroscopy—Reporting of results of thin-film analysis; October 2013) of M changes due to the bond formation to the substrate.

If the temperature of the substrate in the process according to the present invention is kept below the decomposition temperature of the compound of general formula (I), typically a monolayer is deposited on the solid substrate. Once a molecule of general formula (I) is deposited on the solid substrate further deposition on top of it usually becomes less likely. Thus, the deposition of the compound of general formula (I) on the solid substrate preferably represents a self-limiting process step. The typical layer thickness of a self-limiting deposition processes step is from 0.01 to 1 nm, preferably from 0.02 to 0.5 nm, more preferably from 0.03 to 0.4 nm, in particular from 0.05 to 0.2 nm. The layer thickness is typically measured by ellipsometry as described in PAS 1022 DE (Referenzverfahren zur Bestimmung von optischen and dielektrischen Materialeigenschaften sowie der Schichtdicke dünner Schichten mittels Ellipsometrie; February 2004).

Often it is desired to build up thicker layers than those just described. In order to achieve this in the process according to the present invention it is preferable to decompose the deposited compound of general formula (I) by removal of all L and X after which further compound of general formula (I) is deposited. This sequence is preferably performed at least twice, more preferably at least 10 times, in particular at least 50 times. Removing all L and X in the context of the present invention means that at least 95 wt.-% of the total weight of L and X in the deposited compound of general formula (I) are removed, preferably at least 98 wt.-%, in particular at least 99 wt.-%. The decomposition can be effected in various ways. The temperature of the solid substrate can be increased above the decomposition temperature.

Furthermore, it is possible to expose the deposited compound of general formula (I) to a plasma like an oxygen plasma or a hydrogen plasma; to oxidants like oxygen, oxygen radicals, ozone, nitrous oxide ($N_2O$), nitric oxide (NO), nitrogendioxde ($NO_2$) or hydrogenperoxide; to reducing agents like hydrogen, alcohols, hydroazine or hydroxylamine; or solvents like water. It is preferable to use oxidants, plasma or water to obtain a layer of a metal oxide. Exposure to water, an oxygen plasma or ozone is preferred. Exposure to water is particularly preferred. If layers of elemental metal are desired it is preferable to use reducing agents. Preferred examples are hydrogen, hydrogen radicals, hydrogen plasma, ammonia, ammonia radicals, ammonia plasma, hydrazine, N,N-dimethylhydrazine, silane, disilane, trisilane, cyclopentasilane, cyclohexasilane, dimethylsilane, diethylsilane, or trisilylamine; more preferably hydrogen, hydrogen radicals, hydrogen plasma, ammonia, ammonia radicals, ammonia plasma, hydrazine, N,N-dimethylhydrazine, silane; in particular hydrogen. The reducing agent can either directly cause the decomposition of the deposited compound of general formula (I) or it can be applied after the decomposition of the deposited compound of general formula (I) by a different agent, for example water. For layers of metal nitrides it is preferable to use ammonia or hydrazine. Small molecules are believed to easily access the metal M due to the planarity of the aromatic part of ligand L which is the consequence of the conjugation of the two iminomethyl groups to the pyrrole unit in ligand L. Typically, a low decomposition time and high purity of the generated film is observed.

A deposition process comprising a self-limiting process step and a subsequent self-limiting reaction is often referred to as atomic layer deposition (ALD). Equivalent expressions are molecular layer deposition (MLD) or atomic layer epitaxy (ALE). Hence, the process according to the present invention is preferably an ALD process. The ALD process is described in detail by George (Chemical Reviews 110 (2010), 111-131).

A particular advantage of the process according to the present invention is that the compound of general formula (I) is very versatile, so the process parameters can be varied in a broad range. Therefore, the process according to the present invention includes both a CVD process as well as an ALD process.

Depending on the number of sequences of the process according to the present invention performed as ALD process, films of various thicknesses are generated. Preferably, the sequence of depositing the compound of general formula (I) onto a solid substrate and decomposing the deposited compound of general formula (I) is performed at least twice. This sequence can be repeated many times, for example 10 to 500, preferably 20 to 200 times, such as 50 or 100 times. Usually, this sequence is not repeated more often than 1000 times. Ideally, the thickness of the film is proportional to the number of sequences performed. However, in practice some deviations from proportionality are observed for the first 30 to 50 sequences. It is assumed that irregularities of the surface structure of the solid substrate cause this non-proportionality.

One sequence of the process according to the present invention can take from milliseconds to several minutes, preferably from 0.1 second to 1 minute, in particular from 1 to 10 seconds. The longer the solid substrate at a temperature below the decomposition temperature of the compound of general formula (I) is exposed to the compound of general formula (I) the more regular films formed with less defects.

The process according to the present invention yields a film. A film can be only one monolayer of deposited compound of formula (I), several consecutively deposited and decomposed layers of the compound of general formula (I), or several different layers wherein at least one layer in the film was generated by using the compound of general formula (I). A film can contain defects like holes. These defects, however, generally constitute less than half of the surface area covered by the film. The film is preferably an inorganic film. In order to generate an inorganic film, all organic ligands L and X have to be removed from the film as described above. More preferably, the film is an elemental metal film. The film can have a thickness of 0.1 nm to 1 μm or above depending on the film formation process as described above. Preferably, the film has a thickness of 0.5 to 50 nm. The film preferably has a very uniform film thickness which means that the film thickness at different places on the substrate varies very little, usually less than 10%, preferably less than 5%. Furthermore, the film is preferably a conformal film on the surface of the substrate. Suitable methods to determine the film thickness and uniformity are XPS or ellipsometry.

The film obtained by the process according to the present invention can be used in an electronic element. Electronic elements can have structural features of various sizes, for example from 100 nm to 100 μm. The process for forming the films for the electronic elements is particularly well suited for very fine structures. Therefore, electronic elements with sizes below 1 μm are preferred. Examples for electronic elements are field-effect transistors (FET), solar cells, light emitting diodes, sensors, or capacitors. In optical devices such as light emitting diodes or light sensors the film according to the present invention serves to increase the reflective index of the layer which reflects light. An example for a sensor is an oxygen sensor, in which the film can serve as oxygen conductor, for example if a metal oxide film is prepared. In field-effect transistors out of metal oxide semiconductor (MOS-FET) the film can act as dielectric layer or as diffusion barrier. It is also possible to make semiconductor layers out of the films in which elemental nickel-silicon is deposited on a solid substrate.

Preferred electronic elements are transistors. Preferably the film acts as contact in a transistor. If the transistor is made of silicon it is possible that after deposition of nickel or cobalt and heating some silicon diffuses into the nickel to form for example NiSi or $CoSi_2$.

EXAMPLES

Example 1

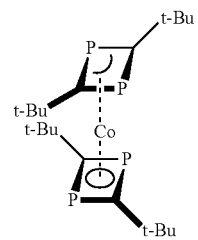

Ia-1

Compound Ia-1 was synthesized according to the procedure by Wolf et al. in Angewandte Chemie International Edition volume 47 (2008), page 4584. It sublimes at 90 to 100° C. at $10^{-2}$ mbar, its melting point is 193° C.

FIG. 1 shows the thermogravimetric analysis data of Ia-1. The residual mass at 500° C. is 27%.

Example 2

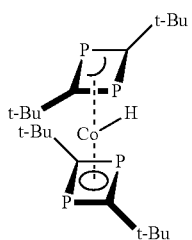

Ia-2

Compound Ia-2 was synthesized according to the procedure by Wolf et al. in Angewandte Chemie International Edition volume 47 (2008), page 4584. It sublimes at 90 to 100° C. at $10^{-2}$ mbar, its melting point is 185° C.

Figure 2:
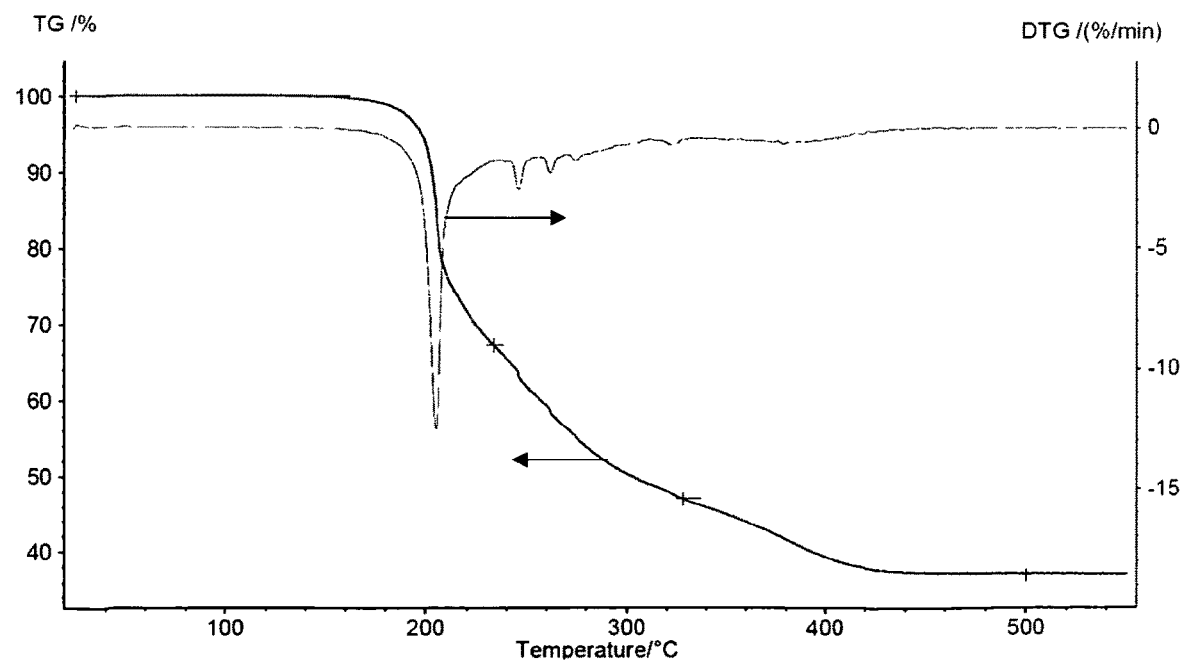

FIG. 2 shows the thermogravimetric analysis data of Ia-1. The residual mass at 500° C. is 37%.

Example 3

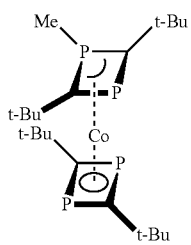

Ia-3

Compound Ia-3 was synthesized according to the procedure by Wolf et al. in Chemistry, A European Journal, volume 16 (2010), page 14322. It sublimes at 100° C. at $10^{-2}$ mbar, its melting point is 196° C.

Figure 3:
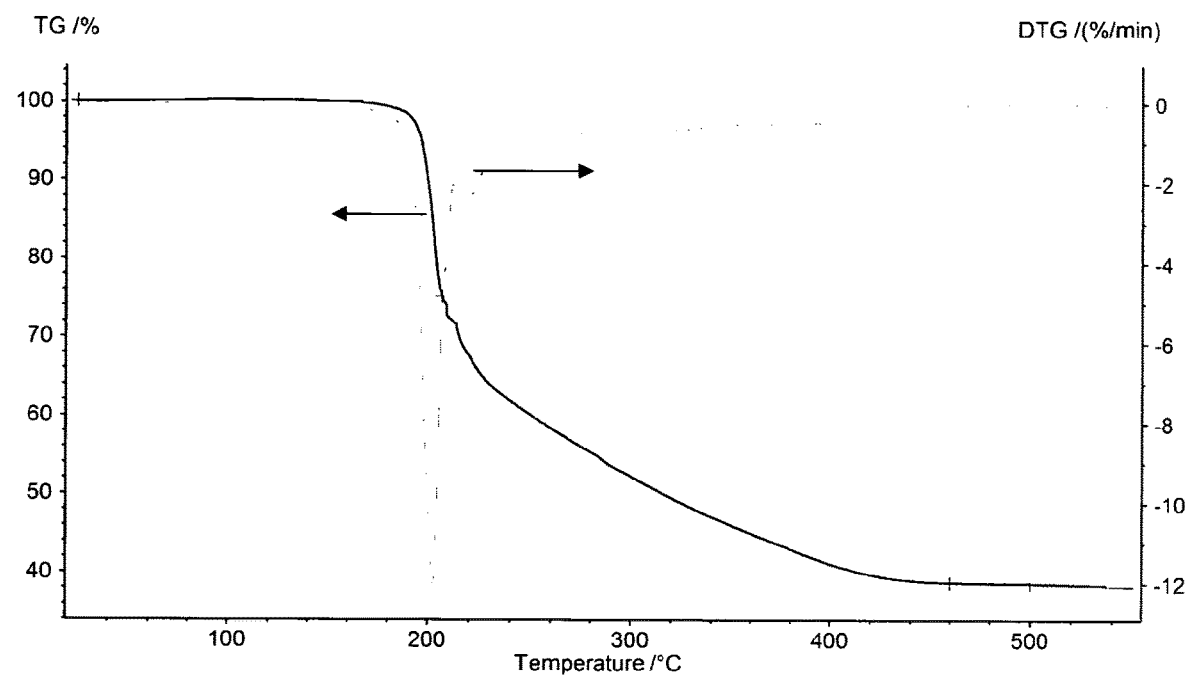

FIG. 3 shows the thermogravimetric analysis data of Ia-3. The residual mass at 500° C. is 38%.

Example 4

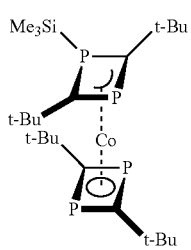

Ia-4

A solution of $Me_3SiCl$ in toluene (0.15 M, 0.87 mmol, 5.7 mL) was added to a solution of $[K(thf)_2\{Co(P_2C_2tBu_2)_2\}]$ (0.43 g, 0.79 mmol) in toluene (30 mL) at room temperature. The reaction mixture was stirred overnight whereupon a dark red solution was formed. The solvent was then removed in vacuo and the deep red residue was extracted with n-pentane (20 mL). Concentrating the red extract to ca. 10 mL and storage at −30° C. for two days gave red crystals of Ia-4. Yield: 0.24 g (58%). It was found that compound Ia-4 contains a variable amount of $[Co(P_2C_2tBu_2)_2H]$ (Ia-3). The contamination was determined to be ca. 4% according to the $^1H$ NMR spectrum.

$^1H$ NMR (400.13 MHz, $C_6D_6$): δ=0.28 (d, J(H,P)=7.0 Hz, 9H, $SiMe_3$), 1.24 (s, 18H, tBu), 1.30 (s, 18H, tBu);

$^{31}P\{^1H\}$ NMR (161.98 MHz, $C_6D_6$): δ=−1.9 (s, 1P), 19.3 (s, 1P), 21.8 (s, 2P). The NMR shifts are similar to the known complex $[Co(P_2C_2tPent_2SiMe_3)(P_2C_2tPent_2)]$ with tPent instead of tBu substituents.

Compound Ia-4 sublimes at 80 to 90° C. at $10^{-2}$ mbar, its melting point is 193° C.

Figure 4:
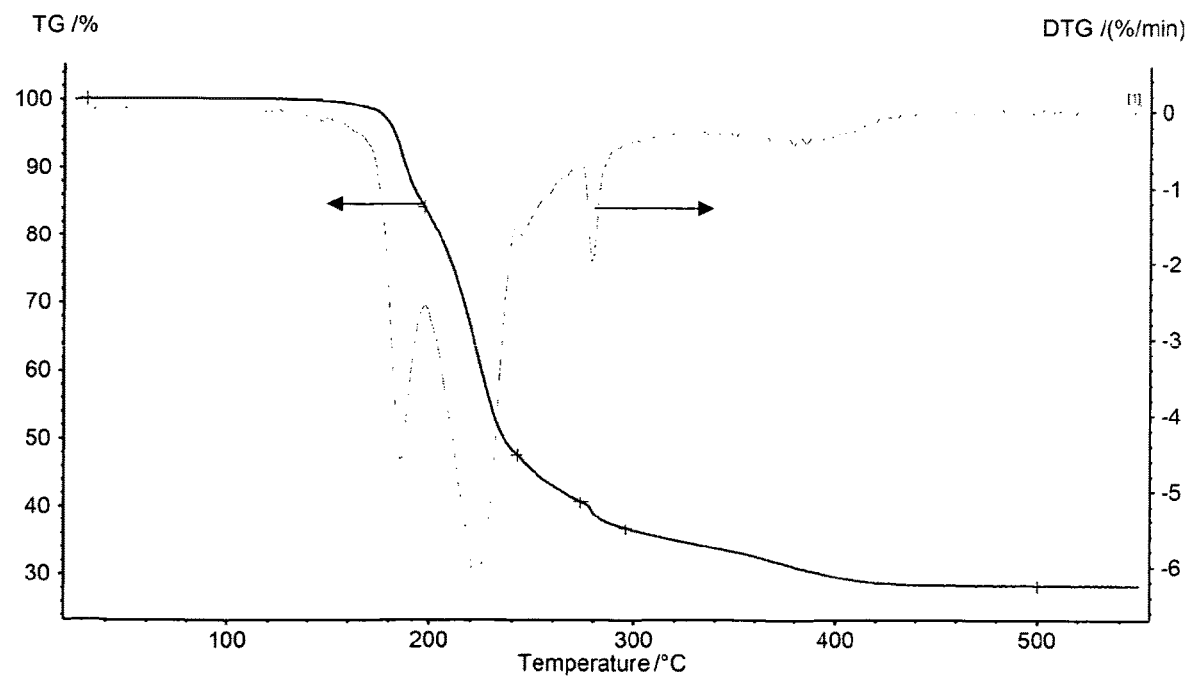

FIG. 4 shows the thermogravimetric analysis data of Ia-4. The residual mass at 500° C. is 30%.

Example 5

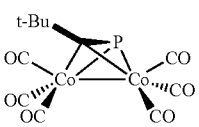

Ic-1

Compound Ic-1 was synthesized according to Burckett-St. Laurent et al. in the Journal of the Chemical Society, Chemical Communications 1981, page 1141-1143. It is purely sublimable due to its waxy, oily nature.

Figure 5:
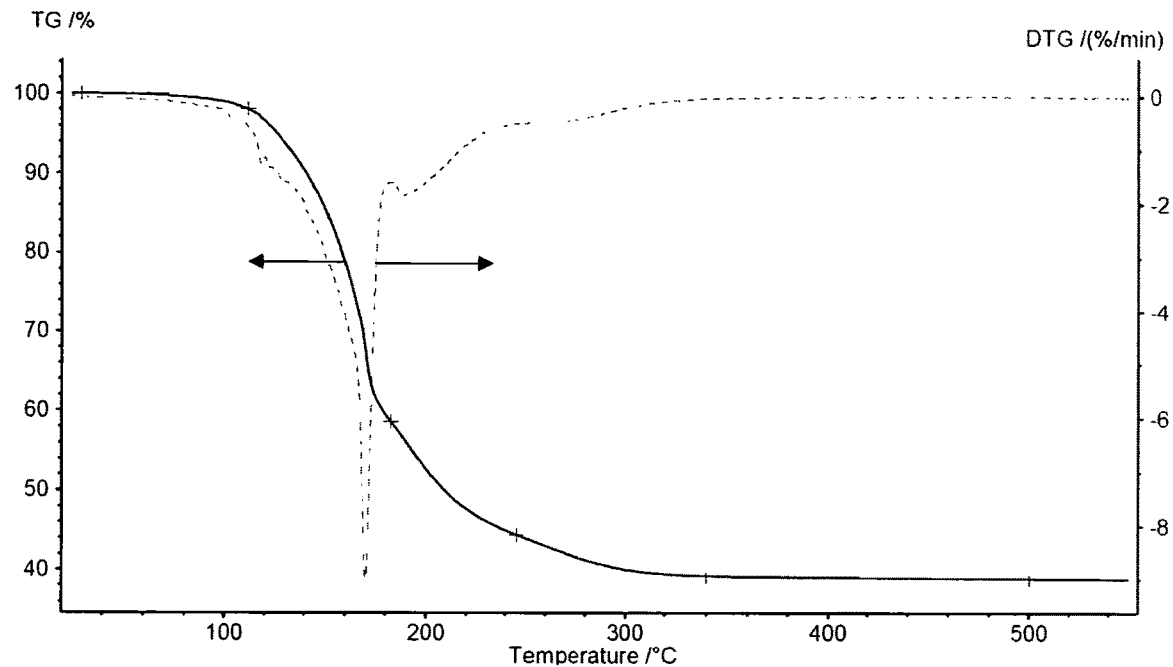

FIG. 5 shows the thermogravimetric analysis data of Ic-1. The residual mass at 500° C. is 39%.

Example 6

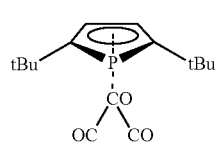

Ib-4

Compound Ib-4 was synthesized according to Organometallics volume 16 (1997), page 2049. The obtained compound is an orange-brown oil.

Figure 6:
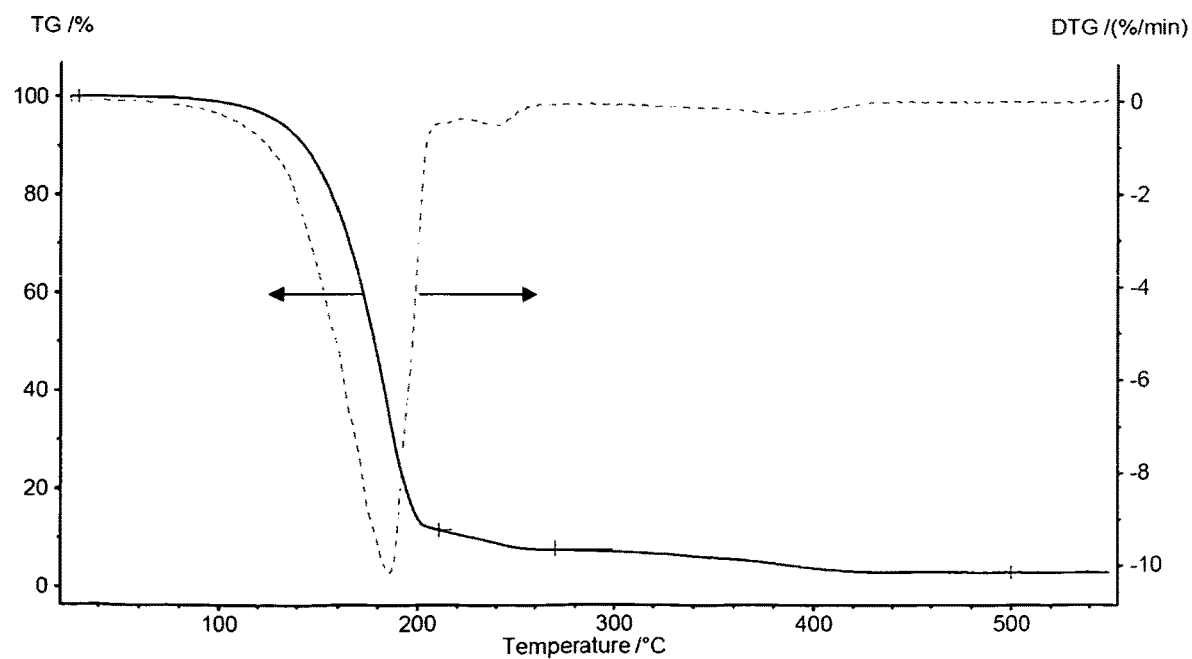

FIG. 6 shows the thermogravimetric analysis data of Ib-4. The residual mass at 500° C. is 11.58%.

The invention claimed is:

1. A process, comprising bringing a compound selected from the group consisting of formula (Ia), formula (Ib), and a dimer of formula (Ic) into $$L_n \text{---} M \text{---} X_m \qquad (I)$$

and depositing the compound from a gaseous or aerosol state onto a solid substrate,
wherein:
the compound of formula (Ia) is $$\overset{1}{L_n} \text{---} M \text{---} X_m \qquad (Ia)$$

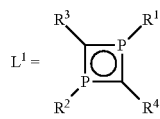

wherein R¹ and R² are each independently nothing, hydrogen, an alkyl group, an aryl group or a silyl group,
wherein R³ and R⁴ are each independently an alkyl group, an aryl group or a silyl group,
the compound of formula (Ib) is

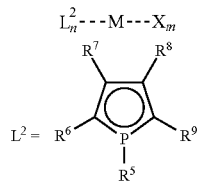

wherein R⁵ is nothing, hydrogen, an alkyl group, an aryl group or a silyl group, and
wherein R⁶ to R⁹ are each independently hydrogen, an alkyl group, an aryl group or a silyl group,
the dimer of formula (Ic) is

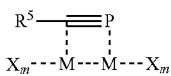

wherein R⁵ is an alkyl group, an aryl group or a silyl group
M is a metal,
X is a ligand which coordinates to M,
n is 1 to 5, and
m is 0 to 5.

2. The process according to claim 1, wherein the compound is formula (Ia)

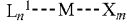

3. The process according to claim 1, wherein the compound is formula (Ib)

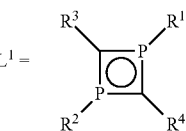

4. The process according to claim 1, wherein the compound is the dimer of formula (Ic)

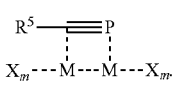

5. The process according claim 1, wherein M is Ni, Co, Mn, Ti, Ta or W.

6. The process according to claim 1, wherein at least one X is a cyclopentadienyl derivative.

7. The process according to claim 1, wherein at least one X is CO.

8. The process according to claim 1, wherein the compound is chemisorbed on a surface of the solid substrate.

9. The process according to claim 1, wherein the deposited compound is decomposed by removal of all ligands L and X.

10. The process according to claim 1, wherein the deposited compound is exposed to a reducing agent.

11. The process according to claim 1, wherein a sequence of depositing the compound onto a solid substrate and decomposing the deposited compound is performed at least twice.

* * * * *

UNITED STATES PATENT AND TRADEMARK OFFICE
CERTIFICATE OF CORRECTION

Page 1 of 2

PATENT NO. : 10,787,738 B2
APPLICATION NO. : 16/063603
DATED : September 29, 2020
INVENTOR(S) : Abels et al.

It is certified that error appears in the above-identified patent and that said Letters Patent is hereby corrected as shown below:

On the Title Page

Column 1, Item (51), under "Int. Cl.", Lines 1-10, delete
"*C23C 16/18* (2006.01)
*C23C 16/448* (2006.01)
*C07F 15/06* (2006.01)
*C23C 16/455* (2006.01)
*C07F 9/6568* (2006.01)
*C23C 16/34* (2006.01)
*C23C 16/40* (2006.01)
C01B 21/06 (2006.01)
C01G 51/04 (2006.01)
C01G 53/04 (2006.01)" and insert -- *C23C 16/18* (2006.01) --, therefor.

On Page 2, Column 2, Item (56), under "OTHER PUBLICATIONS", Line 11, "Page." should read -- page. --;

On Page 2, Column 2, Item (56), under "OTHER PUBLICATIONS", Line 12, "et al." should read -- et al., --.

In the Specification

In Column 2, Line 65, "carbonmonoxide" should read -- carbon monoxide --.

In Column 3, Lines 52-53, "trimethylphosphane." should read -- trimethylphosphine. --.

In Column 4, Line 36, "anthrancenyl," should read -- anthracenyl, --;

In Column 4, Line 54, "siliyl" should read -- silyl --;

Signed and Sealed this
Twenty-third Day of March, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,787,738 B2

In Column 4, Lines 56-57, "di methylcyclohexylsilyl," should read
-- dimethylcyclohexylsilyl, --.

In Column 8, Line 59, "nitrogendioxde" should read -- nitrogen dioxide --;

In Column 8, Line 59, "hydrogenperoxide;" should read -- hydrogen peroxide; --.

In Column 12, Lines 41-44, "$\overset{\overset{\!|}{Co}}{OC\diagup\phantom{xx}\diagdown CO}$" should read -- $\overset{\overset{\!|}{Co}}{OC\diagup\phantom{xx}\diagdown CO}$ --.

In the Claims

In Column 14, Claim 5, Line 31, "according" should read -- according to --.